(12) United States Patent
Kim et al.

(10) Patent No.: US 12,293,958 B2
(45) Date of Patent: May 6, 2025

(54) SEMICONDUCTOR DEVICE INCLUDING HARD MACRO

(71) Applicant: Samsung Electronics Co., Ltd., Suwon-si (KR)

(72) Inventors: Jong Doo Kim, Yongin-si (KR); Sang Do Park, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1030 days.

(21) Appl. No.: 17/236,018

(22) Filed: Apr. 21, 2021

(65) Prior Publication Data

US 2022/0130737 A1   Apr. 28, 2022

(30) Foreign Application Priority Data

Oct. 26, 2020 (KR) .................. 10-2020-0139181

(51) Int. Cl.
*H01L 23/48* (2006.01)
*H01L 23/522* (2006.01)
*H01L 23/528* (2006.01)

(52) U.S. Cl.
CPC ........ *H01L 23/481* (2013.01); *H01L 23/5226* (2013.01); *H01L 23/5283* (2013.01); *H01L 23/5286* (2013.01)

(58) Field of Classification Search
CPC ............ H01L 27/0207; H01L 23/5286; H01L 2225/06541; H01L 2225/06548; H01L 23/5226; H01L 23/49827; H01L 23/481; G06F 30/394

See application file for complete search history.

(56) References Cited

U.S. PATENT DOCUMENTS

| | | | |
|---|---|---|---|
| 8,247,906 B2 * | 8/2012 | Law | H01L 23/5286 257/776 |
| 8,264,067 B2 * | 9/2012 | Law | H01L 24/73 257/E21.597 |
| 9,054,162 B2 * | 6/2015 | Fischer | H01L 21/76898 |

(Continued)

FOREIGN PATENT DOCUMENTS

| | | |
|---|---|---|
| JP | 2011014910 A | 1/2011 |
| KR | 1020140090063 A | 7/2014 |

OTHER PUBLICATIONS

Office Action dated Oct. 14, 2024, issued from the Korean Intellectual Property Office for corresponding application No. KR 10-2020-0139181.

*Primary Examiner* — Nicholas J Tobergte

(74) *Attorney, Agent, or Firm* — Muir Patent Law, PLLC

(57) ABSTRACT

A semiconductor device is provided. The semiconductor device includes a substrate which comprises a first surface and a second surface opposing each other, and a hard macro which is disposed on the first surface of the substrate. The hard macro comprises a cell area and a halo area formed along the periphery of the cell area. In addition, the hard macro comprises a first connection wiring disposed at a first metal level and having at least a part extending from the cell area to the halo area, a first power rail which is disposed on the second surface of the substrate and receives a first voltage, and a first through via which penetrates the halo area and the substrate to connect the first power rail and the first connection wiring and is a single structure.

18 Claims, 12 Drawing Sheets

(56) References Cited

U.S. PATENT DOCUMENTS

| | | | |
|---|---|---|---|
| 9,870,962 B1* | 1/2018 | Lam | H01L 29/0847 |
| 10,032,707 B2 | 7/2018 | Lai et al. | |
| 10,186,510 B2* | 1/2019 | Schultz | H01L 29/7827 |
| 10,607,938 B1 | 3/2020 | Rubin et al. | |
| 10,636,739 B2 | 4/2020 | Beyne et al. | |
| 11,756,876 B2* | 9/2023 | Lai | H01L 23/481 |
| | | | 257/774 |
| 2007/0122922 A1* | 5/2007 | Crowell | H01L 22/14 |
| | | | 438/17 |
| 2010/0252934 A1* | 10/2010 | Law | H01L 21/76898 |
| | | | 257/E21.597 |
| 2012/0292777 A1 | 11/2012 | Lotz | |
| 2020/0042668 A1 | 2/2020 | Peng et al. | |
| 2020/0105671 A1 | 4/2020 | Lai et al. | |
| 2020/0134128 A1 | 4/2020 | Peng et al. | |

* cited by examiner

SEMICONDUCTOR DEVICE INCLUDING HARD MACRO

CROSS-REFERENCE TO RELATED APPLICATIONS

This application claims the benefit under 35 U.S.C. § 119 to Korean Patent Application No. 10-2020-0139181, filed on Oct. 26, 2020, in the Korean Intellectual Property Office, the disclosure of which is incorporated herein in its entirety by reference.

TECHNICAL FIELD

The present disclosure relates to a semiconductor device.

BACKGROUND

With the rapid spread of information media, functions of semiconductor devices are dramatically developing. Recent semiconductor products are required to be low in cost for competitiveness and highly integrated for high quality. For high integration, semiconductor devices are being scaled down.

As the pitch size is reduced, research is being conducted on methods of supplying power to a semiconductor device.

SUMMARY

Aspects of the present disclosure provide a semiconductor device which uses an existing hard macro and is supplied with power without an increase in area.

According to an example embodiment of the present disclosure, a semiconductor device includes a substrate which comprises a first surface and a second surface opposing each other, a hard macro which is disposed on the first surface of the substrate and comprises a cell area and a halo area formed along the periphery of the cell area, and a first connection wiring disposed at a first metal level, the first connection wiring having at least a part extending from the cell area to the halo area, a first power rail which is disposed on the second surface of the substrate and receives a first voltage, and a first through via which penetrates the halo area and the substrate to connect the first power rail and the first connection wiring, wherein the first through via is a single structure.

According to an example embodiment of the present disclosure, a semiconductor device includes a first substrate which comprises a power rail for providing a voltage and a signal line for transmitting a signal, a second substrate which is disposed on the first substrate, a logic area which is disposed on an upper surface of the second substrate, a hard macro which is disposed on the upper surface of the second substrate and comprises a cell area and a halo area formed along a periphery of the cell area, a first through via which is disposed in the halo area, penetrates the second substrate, and is connected to the power rail to provide the voltage to the hard macro, and a second through via which is disposed in the logic area in a grid form, penetrates the second substrate, and is connected to the power rail to provide the voltage to the logic area or is connected to the signal line to provide the signal to the hard macro.

According to an example embodiment of the present disclosure, a semiconductor device includes a substrate which comprises a first surface and a second surface opposing each other, a hard macro which is disposed on the first surface of the substrate and comprises a cell area and a halo area formed along the periphery of the cell area, and a first connection wiring disposed at a first metal level, the first connection wiring having at least a part extending from the cell area to the halo area, a logic area which is disposed on the first surface of the substrate, is spaced apart from the hard macro, and comprises a second connection wiring disposed at the first metal level, first and second power rails which are disposed on the second surface of the substrate and spaced apart from each other, a first through via which is disposed in the halo area of the hard macro and penetrates the halo area and the substrate to connect the first power rail and the first connection wiring, and a second through via which is disposed in the logic area and penetrates the substrate to connect the second power rail and the second connection wiring.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

These and/or other aspects will become apparent and more readily appreciated from the following description of the embodiments, taken in conjunction with the accompanying drawings in which like numerals refer to like elements throughout. In the drawings.

DETAILED DESCRIPTION

Figure 1:
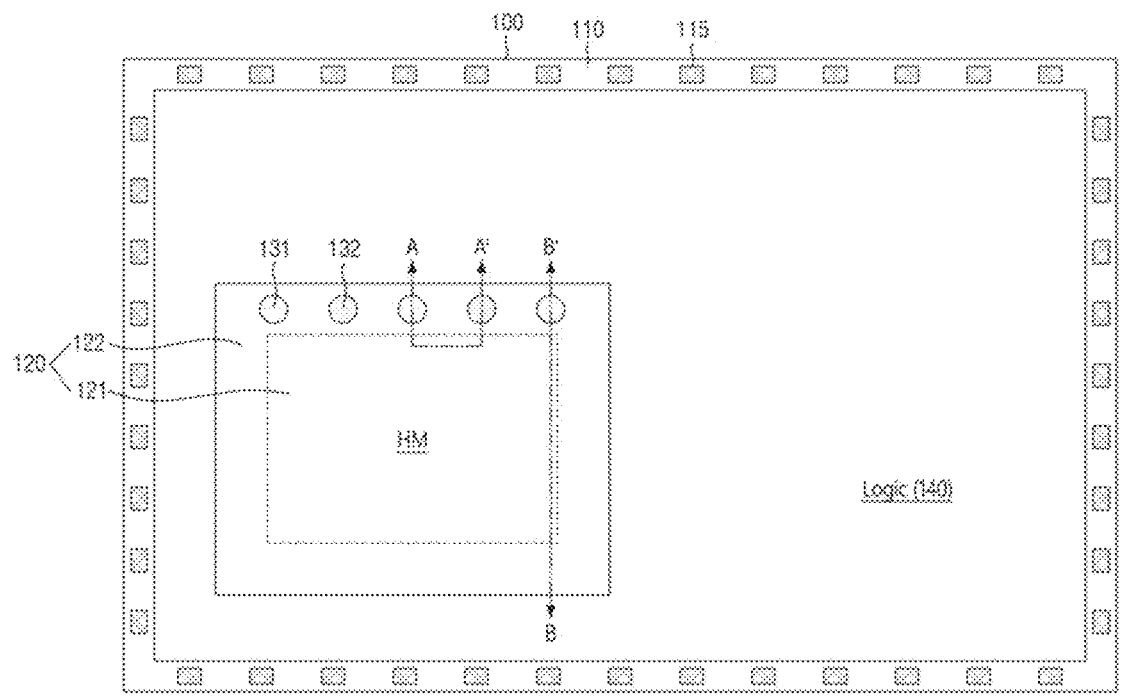
FIG. 1 is a plan view of a semiconductor device, according to example embodiments.

FIG. 1 is a plan view of a semiconductor device 100 according to embodiments.

Referring to FIG. 1, the semiconductor device 100 according to the embodiments may include an input/output area 110, a hard macro 120, and a logic area 140.

The input/output area 110 may include various input/output pads 115 for exchanging data or signals with the outside of the semiconductor device 100.

The hard macro 120 may be various intellectual properties (IPs). IP may refer to reusable blocks that are implemented to have a fixed layout and interconnection specified to perform a desired electrical function. Those skilled in the art will appreciate that the disclosed intellectual properties may be physically implemented by electronic (or optical) circuits, such as logic circuits, discrete components, microprocessors, hard-wired circuits, memory elements, wiring connections, buses, communication links, and the like, which may be formed using semiconductor-based fabrication techniques or other manufacturing technologies. The hard macro 120 may be an area where, for example, a phase locked loop (PLL), an analog-to-digital converter (ADC), a digital-to-analog converter (DAC), a memory block, etc. are formed. In the semiconductor device 100 according to the embodiments, the hard macro 120 may be a static random access memory (SRAM).

The hard macro 120 may include a cell area 121 and a halo area 122.

The cell area 121 may be an area in which an integrated circuit is formed in the hard macro 120. The cell area 121 may include, for example, a first side and a second side opposing each other and a third side and a fourth side connecting the first side and the second side and opposing each other. The first and second sides may be parallel to one another, and the third and fourth sides may be parallel to one another. For example, the cell area 121 may include first and second sides which oppose each other in a length direction of the first substrate 130, and third and fourth sides which oppose each other in a width direction of the first substrate 130.

The halo area 122 may be formed along the periphery of the cell area 121. The halo area 122 may be disposed on the first through fourth sides of the cell area 121. The halo area 122 may surround the cell area 121. The halo area 122 may be an area that separates the cell area 121 of the hard macro 120 and the logic area 140, that is, an area that separates the integrated circuit formed in the hard macro 120 and the logic area 140.

A plurality of standard cells may be disposed in the logic area 140. A standard cell may refer to a unit of an integrated circuit in which a size of the layout satisfies a predetermined rule. Heights of the standard cells may be constant, and widths of the standard cells may be different according to the standard cells. The standard cells may include single height cells disposed in one row and multi-height cells corresponding to a plurality of rows. Each of the standard cells may include an input pin and an output pin and may process an input signal received through the input pin and output an output signal through the output pin. For example, the standard cells may include basic cells such as an AND, an OR, a NOR, and an inverter, complex cells such as an OR/AND/INVERTER (OAI) and an AND/OR/INVERTER (AOI), and storage elements such as a master-slave flip flop and a latch.

Through vias 131 and 132 may be formed in the halo area 122 of the hard macro 120. For example, the through vias 131 and 132 may be formed on at least one of the first through fourth sides of the cell area 121 of the hard macro 120. As illustrated in FIG. 1, the through vias 131 and 132 may be formed in the halo area 122 formed on any one of the first through fourth sides of the cell area 121.

The through vias 131 and 132 may provide voltages to the hard macro 120. The through vias 131 and 132 may include, for example, first through vias 131 and second through vias 132. The first through vias 131 and the second through vias 132 may be, for example, alternately arranged. However, the present disclosure is not limited thereto, and the first through vias 131 and the second through vias 132 may be arranged in various forms.

For example, the first through vias 131 may provide a first voltage to the hard macro 120, and the second through vias 132 may provide a second voltage different from the first voltage to the hard macro 120. The first voltage may be a power supply voltage, and the second voltage may be a ground voltage. This will now be described in detail with reference to FIGS. 2 and 3.

Figure 2:
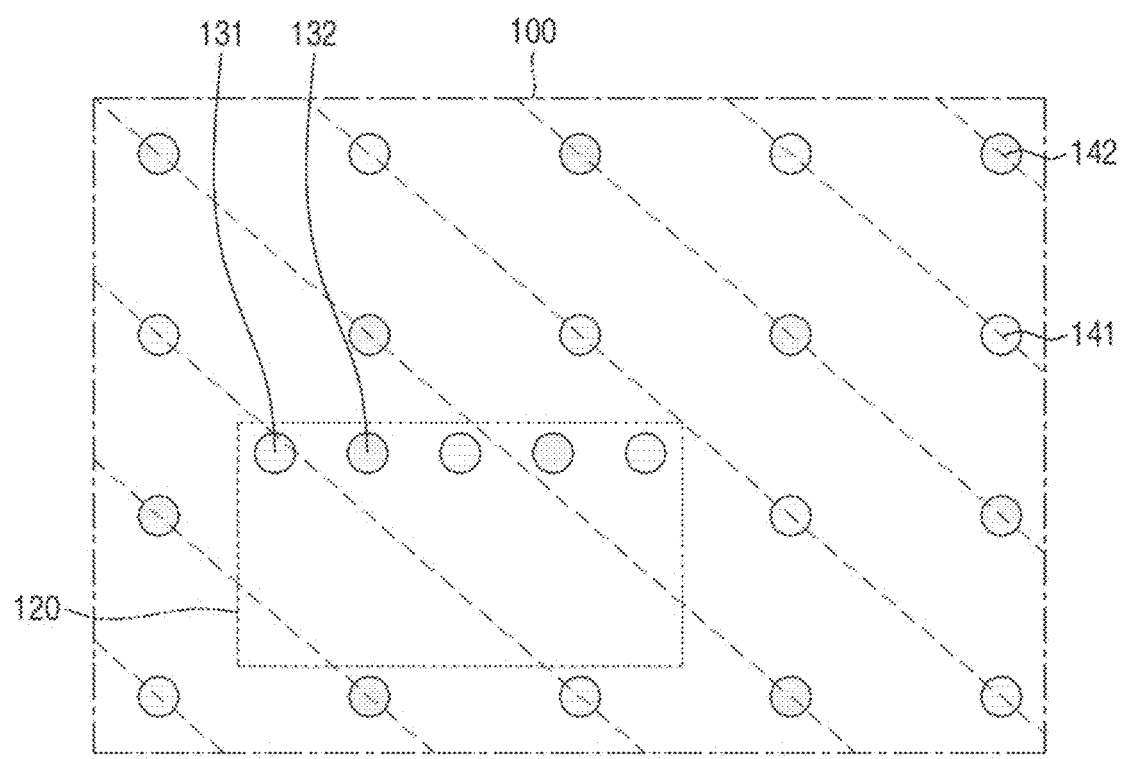
FIG. 2 is a bottom view of the semiconductor device of FIG. 1.

FIG. 2 is a bottom view of the semiconductor device 100 of FIG. 1. In FIG. 2, only through vias 131, 132, 141, and 142 disposed in the semiconductor device 100 are illustrated.

Referring to FIGS. 1 and 2, the hard macro 120 and the logic area 140 may require different voltages. Therefore, arrangements of the through vias 131, 132, 141, and 142 formed in the logic area 140 and the hard macro 120 may be different.

For example, third through vias 141 and fourth through vias 142 may be arranged in the logic area 140 in a grid form. The third through vias 141 and the fourth through vias 142 may be alternately arranged and may respectively be arranged along a diagonal direction as illustrated in FIG. 2. The third through vias 141 and the fourth through vias 142 may also be arranged in various patterns, unlike in FIG. 2.

The logic area 140 of the semiconductor device 100 may receive voltages through the third through vias 141 and the fourth through vias 142. For example, the third through vias 141 may provide the first voltage to the logic area 140, and the fourth through vias 142 may provide the second voltage different from the first voltage to the logic area 140. The first voltage may be the power supply voltage, and the second voltage may be the ground voltage.

Figure 3:
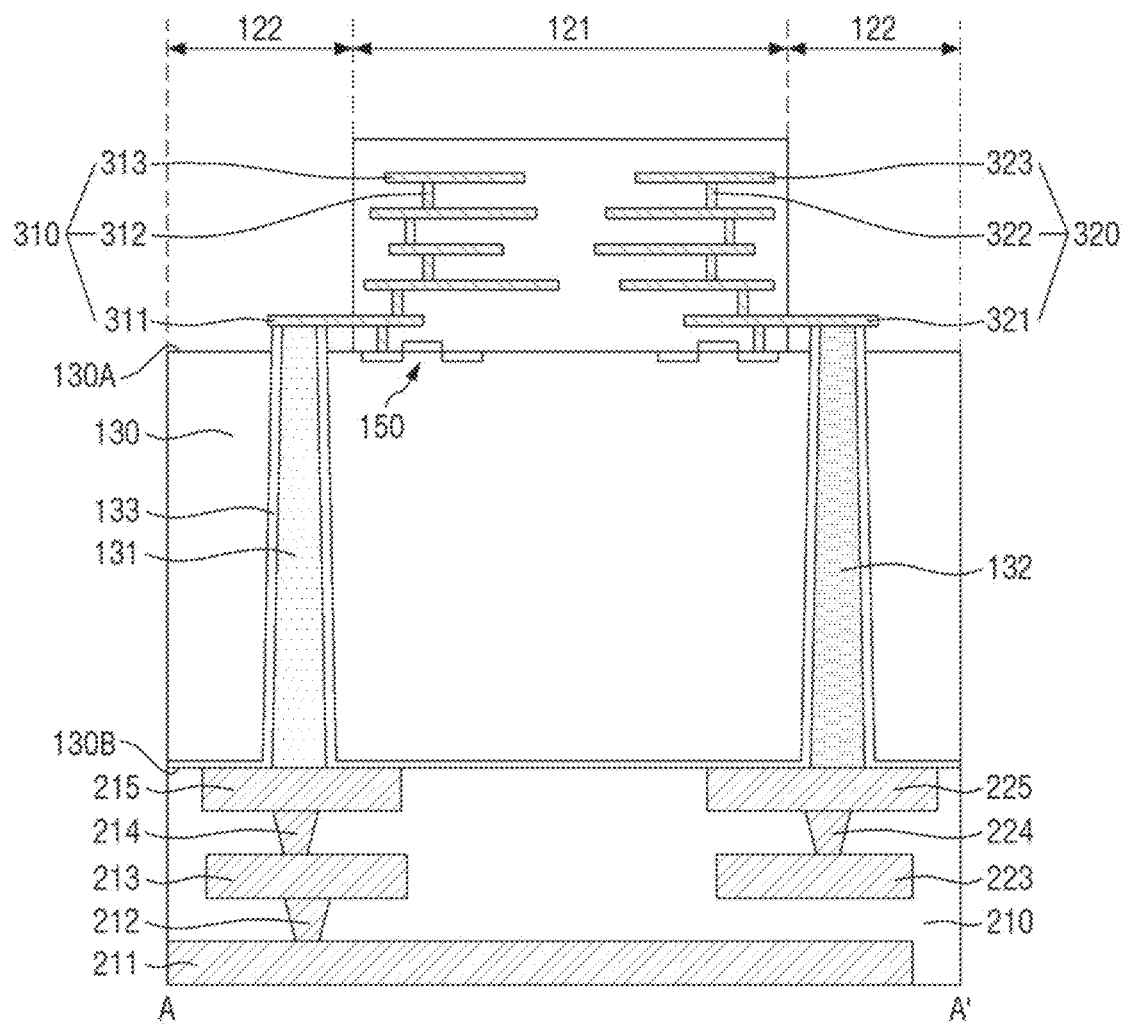
FIG. 3 is a cross-sectional view taken along line A-A' of FIG. 1.
Figure 4:
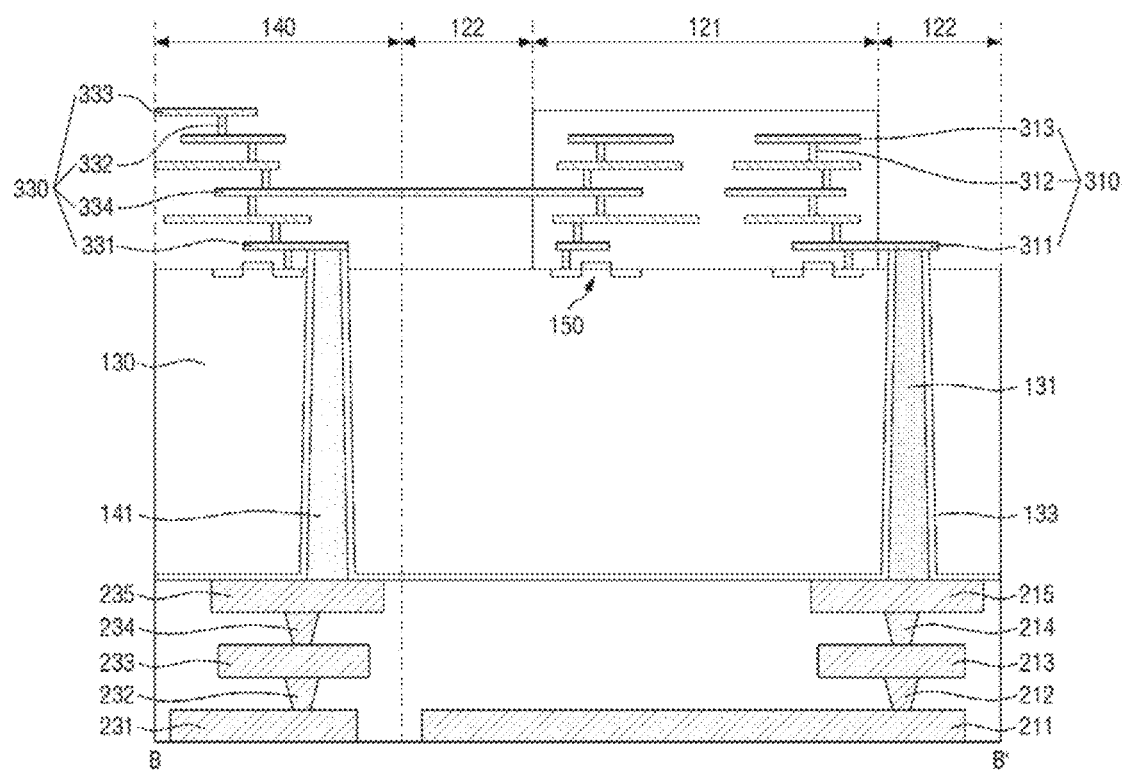
FIG. 4 is a cross-sectional view taken along line B-B' of FIG. 1.
Figure 5:
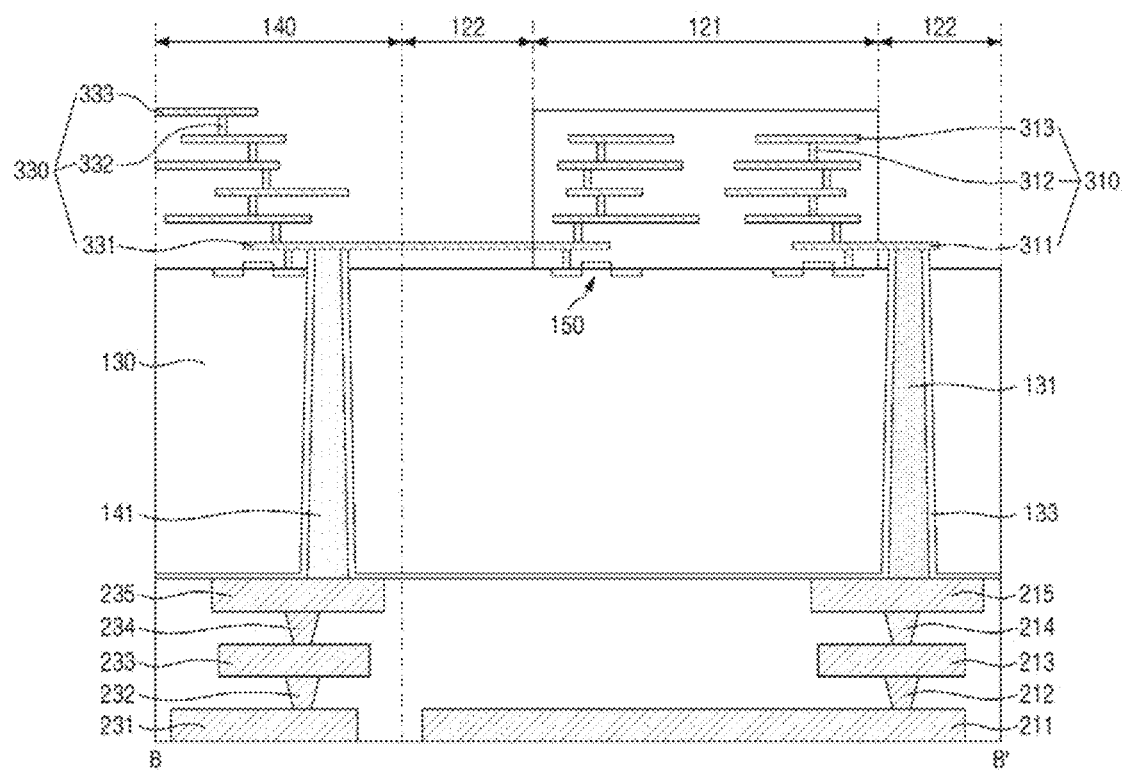
FIG. 5 is a cross-sectional view taken along line B-B' of FIG. 1.

FIG. 3 is a cross-sectional view taken along line A-A' of FIG. 1. FIGS. 4 and 5 are cross-sectional views taken along line B-B' of FIG. 1.

At least some of the third through vias 141 and the fourth through vias 142 disposed in the logic area 140 illustrated in FIG. 2 may receive signals. A case where a third through via 141 receives a signal will now be described.

Referring to FIGS. 1, 3, and 4, the semiconductor device 100 may include the hard macro 120, a first substrate 130, and a second substrate 210.

The first substrate 130 may include a first surface 130A and a second surface 130B opposing each other. For example, the first surface 130A may be an upper surface of the first substrate 130, and the second surface 130B may be a lower surface of the first substrate 130. The first surface 130A and the second surface 130B may be parallel to one another.

The first substrate 130 may be bulk silicon or silicon-on-insulator (SOI). Alternatively, the first substrate 130 may be, but is not limited to, a silicon substrate or a substrate made of another material such as silicon germanium, silicon germanium on insulator (SGOI), indium antimonide, lead telluride, indium arsenide, indium phosphide, gallium arsenide, or gallium antimonide.

The first substrate 130 may include a first through via 131, a second through via 132, a barrier layer 133, and a third through via 141.

The first through via 131 and the second through via 132 may penetrate the first substrate 130 in the halo area 122. The third through via 141 may penetrate the first substrate 130 in the logic area 140. At least a part of each of the first through third through vias 131, 132, and 141 may protrude from the first surface 130A of the first substrate 130.

Each of the first through third through vias 131, 132, and 141 may be a single structure. For example, each of the first through third through vias 131, 132, and 141 may be a homogeneous monolithic structure. Each of the first through third through vias 131, 132, and 141 may penetrate the first substrate 130.

In some embodiments, the first through third through vias 131, 132, and 141 may be formed from the second surface 130B of the first substrate 130 after the hard macro 120 is formed on the first substrate 130. Accordingly, widths of the first through third through vias 131, 132, and 141 may be reduced in a direction from the second surface 130B of the first substrate 130 toward the first surface 130A.

The barrier layer 133 may cover side surfaces of the first through third through vias 131, 132, and 141. The barrier layer 133 may extend along the second surface 130B of the first substrate 130.

The barrier layer 133 may include at least one of, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a two-dimensional (2D) material. In the semiconductor device 100 according to the embodiments, the 2D material may be a metallic material and/or a semiconductor material. The 2D material may include a 2D allotrope or a 2D compound and may include at least one of, for example, graphene, molybdenum disulfide (MoS2), molybdenum diselenide ($MoSe_2$), tungsten diselenide ($WSe_2$), and tungsten disulfide ($WS_2$). However, the present disclosure is not limited thereto. For example, since the above 2D materials are only listed as examples, the 2D materials that can be included in the semiconductor device 100 of the present disclosure are not limited to the above materials.

The hard macro 120 may be disposed on the first surface 130A of the first substrate 130. The hard macro 120 may include transistors 150 and connection wiring structures 310 and 320.

The transistors 150 may receive voltages from the connection wiring structures 310 and 320. A transistor 150 may receive a signal from a connection wiring structure 330. The transistors 150 may receive voltages from connection wirings 311 and 321 formed at a first metal level to be described later. The transistor 150 may receive a signal from a connection wiring 331 formed at the first metal level to be described later.

The connection wiring structures 310, 320, and 330 may include a plurality of connection wirings 311, 313, 321, 323, 331, 333, and 334 and a plurality of connection vias 312, 322, and 332. The connection vias 312, 322, and 332 may connect the connection wirings 311, 313, 321, 323, 331, 333, and 334 to each other. The connection wirings 311, 313, 321, 323, 331, 333, and 334 and the connection vias 312, 322, and 332 may be stacked, for example, in the direction from the second surface 130B of the first substrate 130 toward the first surface 130A, and the number of layers of the connection wirings 311, 313, 321, 323, 331, 333, and 334 and the connection vias 312, 322, and 332 may be vary.

The connection wirings 311, 313, 321, 323, 331, 333, and 334 may include first connection wirings 311, 321, and 331 disposed at the first metal level and second connection wirings 313, 323, 333, and 334 disposed on the first connection wirings 311, 321, and 331.

In some embodiments, at least a part of each of the first connection wirings 311 and 321 may extend from the cell area 121 to the halo area 122. The second connection wirings 313 and 323 may not overlap the first connection wirings 311 and 321 in a direction from the first surface 130A of the first substrate 130 toward the second surface 130B. For example, the second connection wirings 313 and 323 may not overlap the first connection wirings 311 and 321 in a direction perpendicular to the first surface 130A of the first substrate 130.

In some embodiments, the first connection wirings 311, 321, and 331 may be directly connected to the first through third through vias 131, 132, and 141, respectively.

The second substrate 210 may be disposed on the second surface 130B of the first substrate 130. The second substrate 210 may include a plurality of power wirings 211, 213, and 223, a plurality of power vias 212, 214, and 224, power rails 215 and 225, a plurality of signal wirings 231 and 233, a plurality of signal vias 232 and 234, and a signal line 235. The second substrate 210 may cover the power wirings 211, 213 and 223, the power vias 212, 214 and 224, the power rails 215 and 225, the signal wirings 231 and 233, the signal vias 232 and 234, and the signal line 235. The second substrate 210 may include, for example, an insulating material.

The power vias 212, 214, and 224 may connect the power wirings 211, 213, and 223 and connect the power wirings 211, 213, and 223 and the power rails 215 and 225 to each other. The power wirings 211, 213, and 223 and the power vias 212, 214, and 224 may be stacked, for example, in the direction from the second surface 130B of the first substrate 130 toward the first surface 130A, and the number of layers of the power vias 212, 214, and 224 and the power wirings 211, 213, and 223 may vary.

The signal vias 232 and 234 may connect the signal wirings 231 and 233 and connect the signal wirings 231 and 233 and the signal line 235 to each other. The signal wirings 231 and 233 and the signal vias 232 and 234 may be stacked, for example, in the direction from the second surface 130B of the first substrate 130 toward the first surface 130A, and the number of layers of the signal wirings 231 and 233 and the signal vias 232 and 234 may vary.

In some embodiments, the second substrate 210 in which the power wirings 211, 213, and 223, the power vias 212, 214, and 224, the power rails 215 and 225, the signal wirings 231 and 233, the signal vias 232 and 234 and the signal line 235 are formed may be bonded onto the second surface 130B of the first substrate 130 in which the hard macro 120 and the first through third through vias 131, 132, and 141 are formed. Accordingly, widths of the power vias 212, 214, and 224 and the signal vias 232 and 234 may be reduced in the direction from the first surface 130A of the first substrate 130 toward the second surface 130B.

First power wirings 211 and 213 and first power vias 212 and 214 among the power wirings 211, 213, and 223 and the power vias 212, 214, and 224 may receive the first voltage. A second power wiring 223 and a second power via 224 among the power wirings 211, 213, and 223 and the power vias 212, 214, and 224 may receive the second voltage. For example, the first voltage may be the power supply voltage, and the second voltage may be the ground voltage. The first voltage and the second voltage may be distributed through the power wirings 211, 213, and 223 and the power vias 212, 214, and 224.

The power rails 215 and 225 may be disposed on the second surface 130B of the first substrate 130. The power rails 215 and 225 may provide voltages received from the power wirings 211, 213, 223 and the power vias 212, 214, and 224 to the hard macro 120 through the first through via 131 and the second through via 132.

A first power rail 215 may be disposed on the first through via 131. The first power rail 215 may be directly connected to the first through via 131. For example, a top surface of the first power rail 215 may contact a bottom surface of the first through via 131. The first power rail 215 may be directly connected to the first connection wiring 311 through the first through via 131 to provide the first voltage.

A second power rail 225 may be disposed on the second through via 132. The second power rail 225 may be directly connected to the second through via 132. For example, a top surface of the second power rail 225 may contact a bottom surface of the second through via 132. The second power rail 225 may be directly connected to the first connection wiring 321 through the second through via 132 to provide the second voltage. Accordingly, the first voltage may be provided to the first connection wiring 311 through the first through via 131, and the second voltage may be provided to the first connection wiring 321 through the second through via 132. Therefore, a voltage drop phenomenon can be prevented or improved.

The power rails 215 and 225 may include at least one of, e.g., a metal and a metal alloy.

In the semiconductor device 100 according to the embodiments, the hard macro 120 may receive the power supply voltage or the ground voltage through the first through via 131 and the second through via 132 disposed in the halo area 122. Accordingly, the hard macro 120 may not require an additional area for receiving the power supply voltage or the ground voltage, thus preventing an increase in the size of the semiconductor device 100. In addition, since the through vias 131 and 132 are simply formed in the halo area 122 of the existing hard macro 120, there is no need to change the design of the existing hard macro 120.

The signal wirings 231 and 233 and the signal vias 232 and 234 may receive a signal.

The signal line 235 may be disposed on the second surface 130B of the first substrate 130. The signal line 235 may provide a signal received from the signal wirings 231 and 233 and the signal vias 232 and 234 to the logic area 140 through the third through via 141.

The signal line 235 may be disposed on the third through via 141. The signal line 235 may be directly connected to the third through via 141. For example, a top surface of the signal line 235 may contact a bottom surface of the third through via 141. The signal line 235 may be directly connected to the first connection wiring 331 through the third through via 141 to provide a signal.

In some embodiments, at least one of the connection wirings 331, 333, and 334 in the logic area 140 may extend in a length or width direction of the first substrate 130 and may be connected to at least one of the connection wirings 321 and 323 of the hard macro 120. The length or width direction may be, for example, a horizontal direction parallel to the first surface 130A of the first substrate 130. For example, as illustrated in FIG. 4, the connection wiring 334 disposed at a metal level, i.e., a third metal level higher than the first metal level may extend to the hard macro 120 and may be connected to a connection wiring 323 disposed at the third metal level in the hard macro 120. However, the present disclosure is not limited thereto, and a connection wiring disposed at a metal level higher than the first metal level may also extend to the hard macro 120 and may be connected to a connection wiring 323 in the hard macro 120.

Referring to FIG. 5, in some other embodiments, the connection wiring 331 disposed at the first metal level in the logic area 140 may extend in the length or width direction of the first substrate 130 and may be connected to the connection wiring 321 disposed at the first metal level in the hard macro 120.

Figure 6:
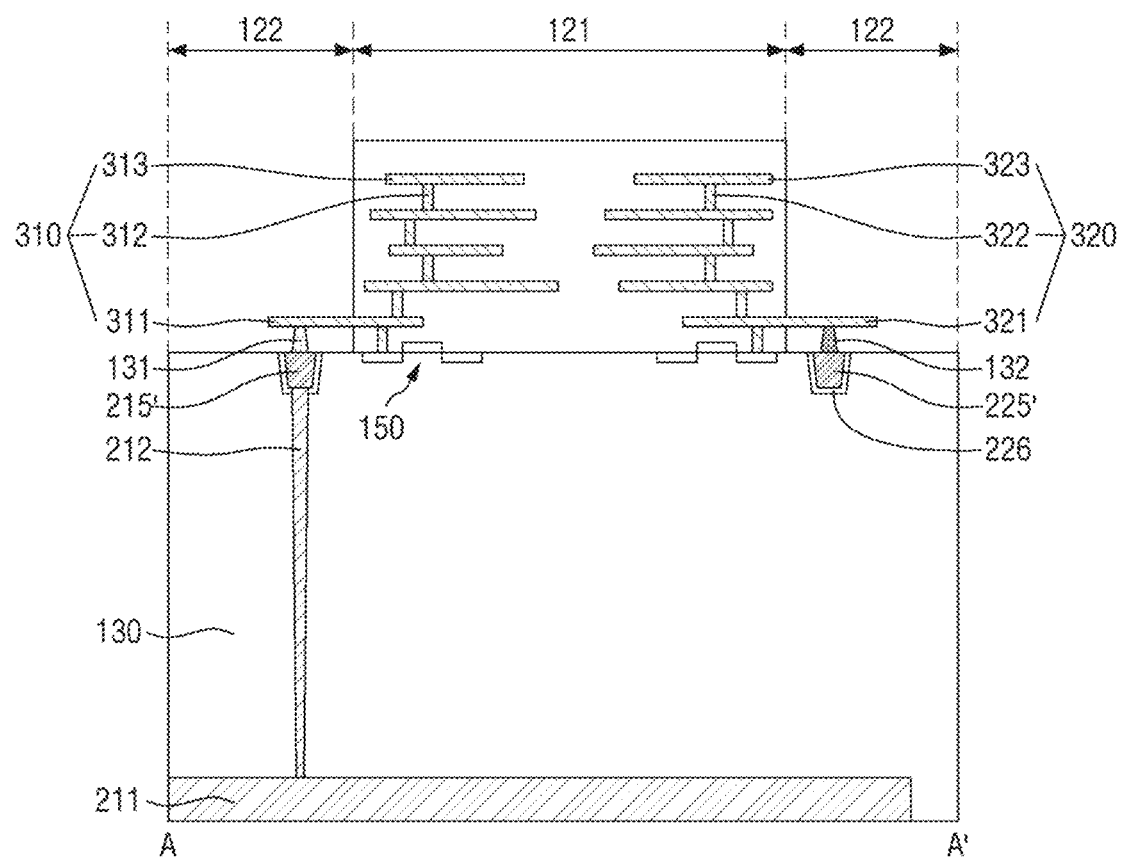
FIG. 6 is a cross-sectional view taken along line A-A' of FIG. 1.

FIG. 6 is a cross-sectional view taken along line A-A' of FIG. 1. The following description will focus on differences from those described with reference to FIGS. 1 through 5.

Referring to FIGS. 1 and 6, a semiconductor device 100 may include buried power rails 215' and 225'.

At least a part of each of the buried power rails 215' and 225' may be buried in a first substrate 130. For example, the part of each of the buried power rails 215' and 225' that is buried in the first substrate 130 may be surrounded by the first substrate 130. Upper surfaces of the buried power rails 215' and 225' may lie in substantially the same plane as an upper surface of the first substrate 130 as illustrated in FIG. 4. For example, the upper surfaces of the buried power rails 215' and 225' may be substantially coplanar with the upper surface of the first substrate 130. However, the present disclosure is not limited thereto, and the buried power rails 215' and 225' may also protrude from the first substrate 130. For example, the upper surfaces of the buried power rails 215' and 225' may extend above the upper surface of the first substrate 130. As used herein, terms such as "same," "equal," "planar," or "coplanar" encompass near identicality including variations that may occur, for example, due to manufacturing processes. The term "substantially" may be used herein to emphasize this meaning, unless the context or other statements indicate otherwise.

A first buried power rail 215' may be directly connected to a first through via 131 and may be directly connected to a first connection wiring 311 through the first through via 131. For example, an upper surface of the first buried power rail 215' may contact a lower surface of the first through via 131, and an upper surface of the first through via 131 may contact a lower surface of the first connection wiring 311. A second buried power rail 225' may be directly connected to a second through via 132 and may be directly connected to a first connection wiring 321 through the second through via 132. For example, an upper surface of the second buried power rail 225' may contact a lower surface of the second through via 132, and an upper surface of the second through via 132 may contact a lower surface of the first connection wiring 321.

The first buried power rail 215' may be connected to a power wiring 211 through a power via 212. For example, a lower surface of the first buried power rail 215' may contact an upper surface of the power via 212, and a lower surface of the power via 212 may contact an upper surface of the power wiring 211. The first buried power rail 215' may provide a voltage received from the power wiring 211 through the power via 212 to a hard macro 120. Although the single-layered power via 121 and the single-layered power wiring 211 are illustrated in the current drawing, the present disclosure is not limited thereto. The first buried power rail 215' and the second buried power rail 225' may also be connected to a plurality of power vias and a plurality of power wirings.

A power rail liner 226 may extend along sidewalls and a bottom surface of each of the buried power rails 215' and 225', contacting the sidewalls and the bottom surface of each of the buried power rails 215' and 225'. Each of the buried power rails 215' and 225' may be disposed on the power rail liner 226'.

The power rail liner 226 may electrically insulate each of the buried power rails 215' and 225' from the first substrate 130. The power rail liner 226 may include an insulating material.

Figure 7:
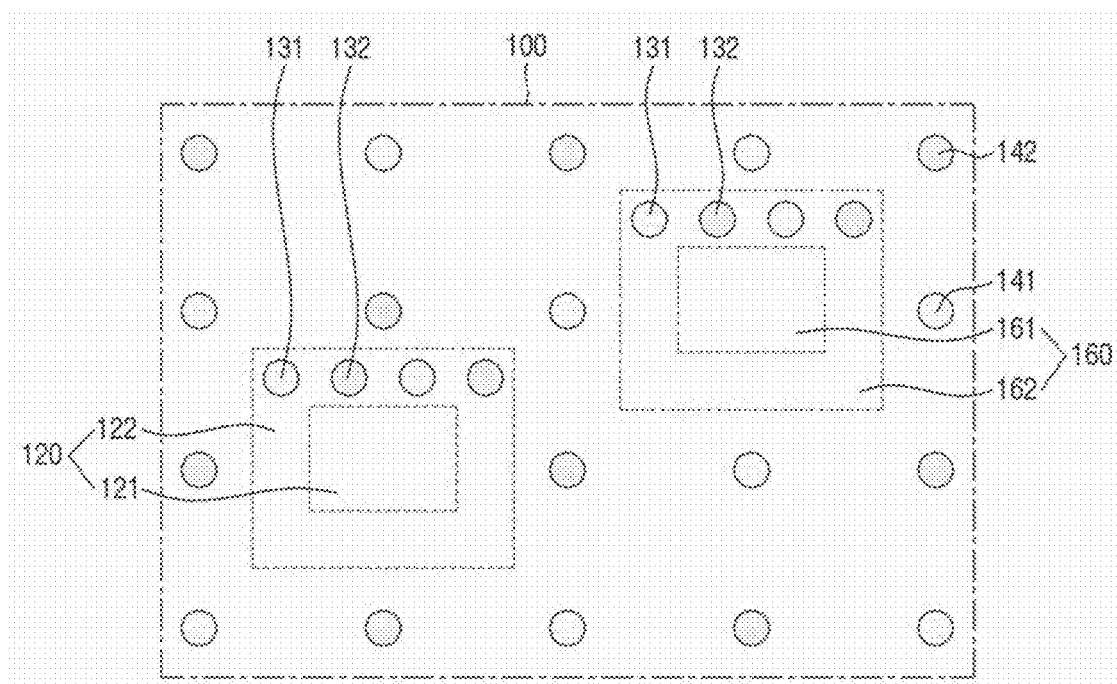
FIG. 7 is a bottom view of the semiconductor device of FIG. 1.

FIG. 7 is a bottom view of the semiconductor device 100 of FIG. 1. The following description will focus on differences from those described with reference to FIG. 2.

Referring to FIG. 7, the semiconductor device 100 may include a first hard macro 120 and a second hard macro 160.

Through vias 131 and 132 may be formed in a halo area 122 of the first hard macro 120 and a halo area 162 of the second hard macro 160. The through vias 131 and 132 may be formed in the halo area 122 or 162 formed on any one of first through fourth sides of each of a cell area 121 of the first hard macro 120 and a cell area 161 of the second hard macro 160.

As illustrated in FIG. 7, the through vias 131 and 132 may be formed in the halo areas 122 and 162 on the same side of the first hard macro 120 and the second hard macro 160. However, the present disclosure is not limited thereto, and the through vias 131 and 132 may also be formed in the halo areas 122 and 162 on different sides of the first hard macro 120 and the second hard macro 160.

Figure 8:
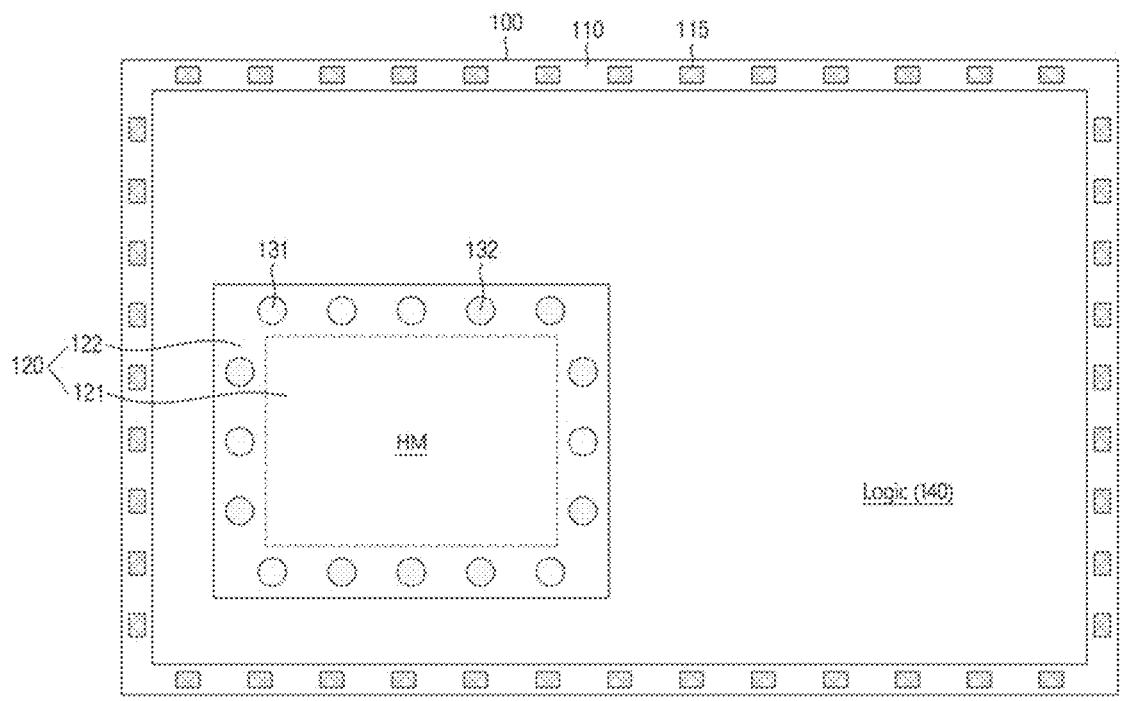
FIG. 8 is a plan view of a semiconductor device, according to example embodiments.

FIG. 8 is a plan view of a semiconductor device 100 according to example embodiments. The following description will focus on differences from those described with reference to FIGS. 1 through 7.

Referring to FIG. 8, in the semiconductor device 100 according to the embodiments, through vias 131 and 132 may be formed in a halo area 122 of a hard macro 120. The through vias 131 and 132 may be formed in the halo area 122 formed on first through fourth sides of a cell area 121.

First through vias 131 and second through vias 132 may be, for example, alternately arranged. However, the present disclosure is not limited thereto, and the first through vias 131 and the second through vias 132 may be arranged in various forms.

Figure 9:
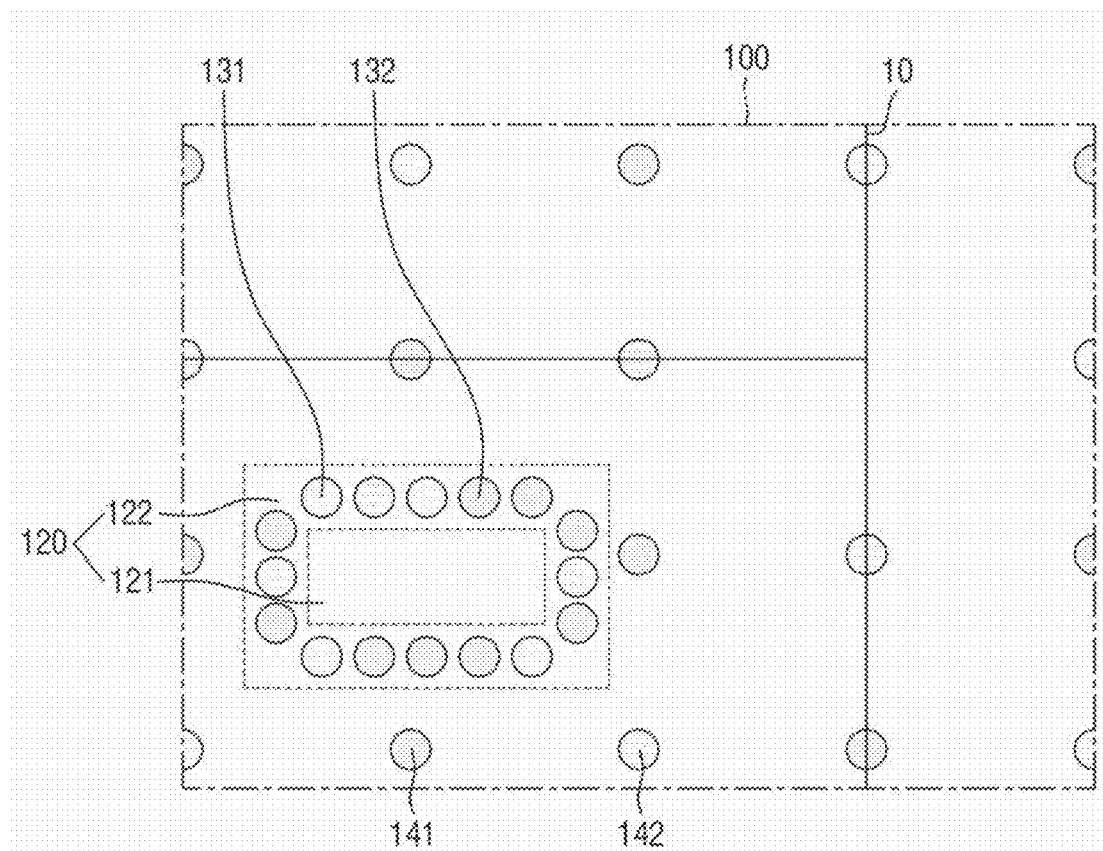
FIG. 9 is a partial, expanded bottom view of the semiconductor device illustrated in FIG. 8.

FIG. 9 is a partial, expanded bottom view of the semiconductor device 100 illustrated in FIG. 8.

Referring to FIG. 9, the semiconductor device 100 may include a plurality of standard cells disposed within boundary lines 10. Third and fourth through vias 141 and 142 may be disposed in a logic area to provide voltages to the standard cells.

The third and fourth through vias 141 and 142 may be disposed on the boundary lines 10 of the standard cells to provide voltages to the standard cells neighboring each other based on the boundary lines 10.

Figure 10:
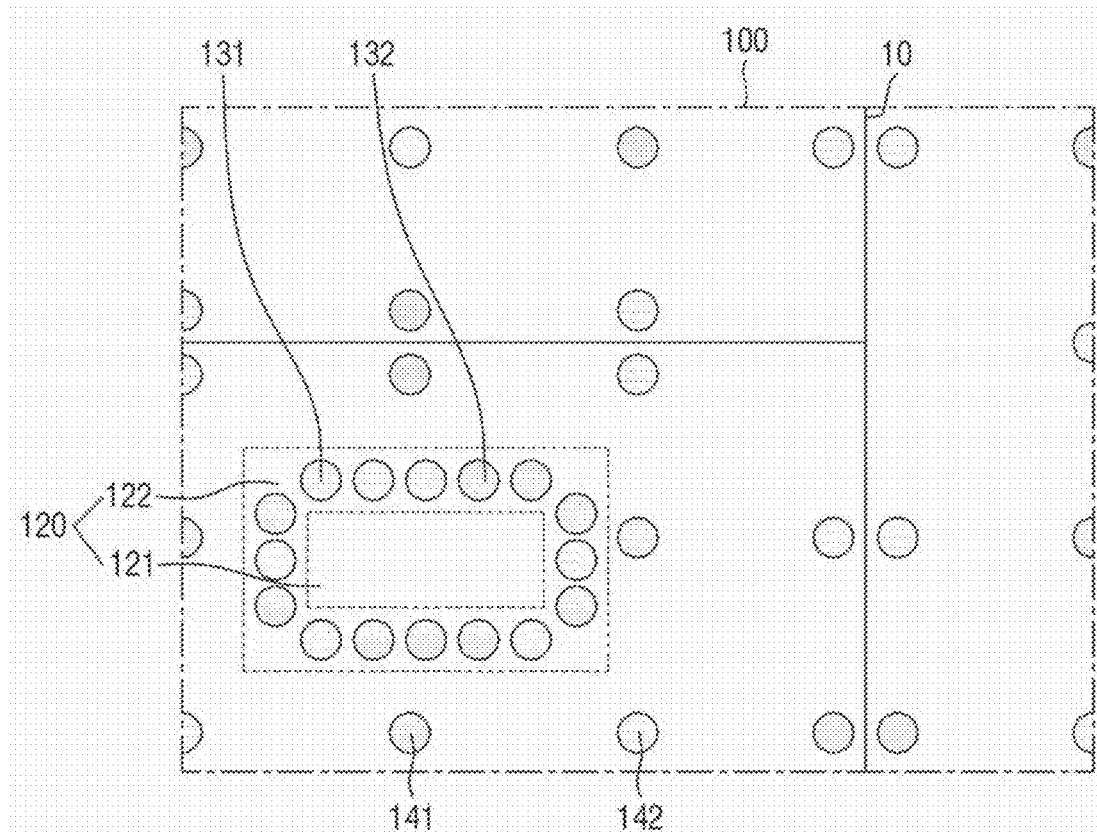
FIG. 10 is a partial, expanded bottom view of the semiconductor device illustrated in FIG. 8.

FIG. 10 is a partial, expanded bottom view of the semiconductor device 100 illustrated in FIG. 8. The following description will focus on differences from those described with reference to FIG. 9.

Referring to FIG. 10, in the semiconductor device 100, third and fourth through vias 141 and 142 may not be disposed on boundary lines 10 and may be spaced apart from the boundary lines 10. The third and fourth through vias 141 and 142 may be used to supply voltages to standard cells disposed within the boundary lines 10. In the semiconductor device 100, the standard cells disposed within the boundary lines 10 may receive different voltages.

Figure 11:
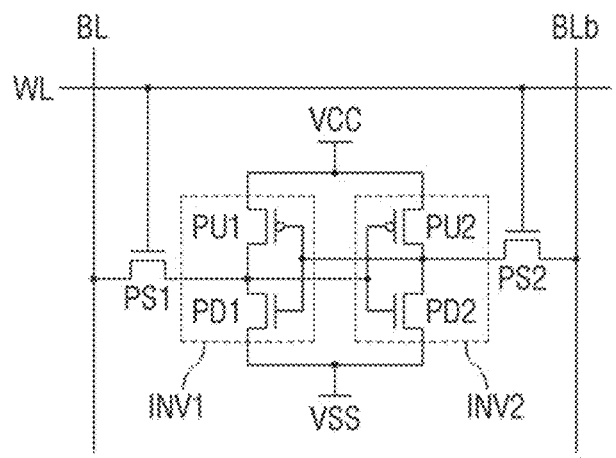
FIG. 11 is an example of a circuit diagram of a hard macro of FIG. 1.
Figure 12:
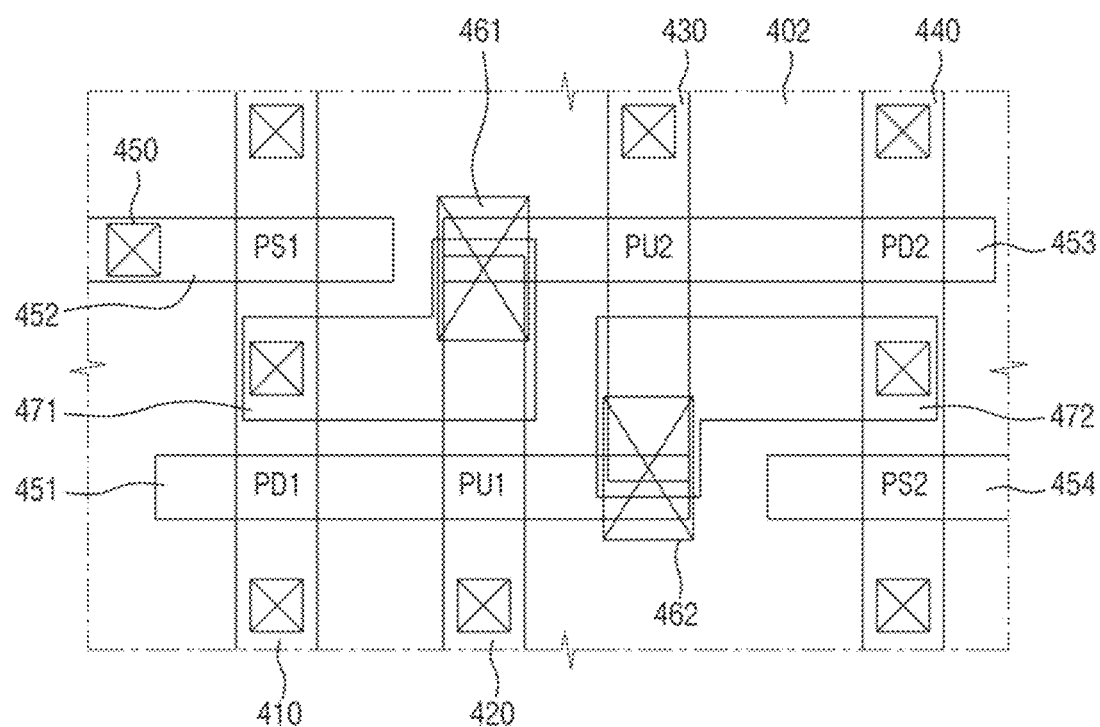
FIG. 12 is a layout diagram of the hard macro of FIG. 11.

FIG. 11 is an example of a circuit diagram of the hard macro 120 of FIG. 1. FIG. 12 is a layout diagram of the hard macro 120 of FIG. 11. FIGS. 11 and 12 are diagrams when the hard macro 120 is an SRAM.

Referring to FIG. 11, the hard macro 120 according to the embodiments may include a pair of inverters INV1 and INV2 connected in parallel between a power node VCC and a ground node VSS and a first pass transistor PS1 and a second pass transistor PS2 connected to respective output nodes of the inverters INV1 and INV2.

The first pass transistor PS1 and the second pass transistor PS2 may be connected to a bit line BL and a complementary bit line BLb, respectively. Gates of the first pass transistor PS1 and the second pass transistor PS2 may be connected to a word line WL.

A first inverter INV1 may include a first pull up transistor PU1 and a first pull down transistor PD1 connected in series between the power node VCC and the ground node VSS, and a second inverter INV2 may include a second pull up transistor PU2 and a second pull down transistor PD2 connected in series between the power node VCC and the ground node VSS.

The first pull up transistor PU1 and the second pull up transistor PU2 may be P-type transistors, and the first pull down transistor PD1 and the second pull down transistor PD2 may be N-type transistors.

In addition, an input node of the first inverter INV1 is connected to an output node of the second inverter INV2, and an input node of the second inverter INV2 is connected to an output node of the first inverter INV1 so that the first inverter INV1 and the second inverter INV2 can form one latch circuit.

Referring to FIG. 12, a first active fin 410, a second active fin 420, a third active fin 430, and a fourth active fin 440 spaced apart from each other may extend lengthwise in a direction (e.g., a vertical direction in FIG. 12). The second active fin 420 and the third active fin 430 may be shorter than the first active fin 410 and the fourth active fin 440.

In addition, a first gate electrode 451, a second gate electrode 452, a third gate electrode 453, and a fourth gate electrode 454 may extend in the other direction (e.g., a horizontal direction in FIG. 12) and may intersect the first through fourth active fins 410 through 440. Specifically, the first gate electrode 451 may completely intersect the first active fin 410 and the second active fin 420 and may partially overlap an end of the third active fin 430. The third gate electrode 453 may completely intersect the fourth active fin 440 and the third active fin 430 and may partially overlap an end of the second active fin 420. The second gate electrode 452 and the fourth gate electrode 454 may intersect the first active fin 410 and the fourth active fin 440, respectively.

As illustrated, the first pull up transistor PU1 may be defined around an area in which the first gate electrode 451 and the second active fin 420 intersect, the first pull down transistor PD1 may be defined around an area in which the first gate electrode 451 and the first active fin 410 intersect, and the first pass transistor PS1 may be defined around an area in which the second gate electrode 452 and the first active fin 410 intersect. The second pull up transistor PU2 may be defined around an area in which the third gate electrode 453 and the third active fin 430 intersect, the second pull down transistor PD2 may be defined around an area in which the third gate electrode 453 and the fourth active fin 440 intersect, and the second pass transistor PS2 may be defined around an area in which the fourth gate electrode 454 and the fourth active fin 440 intersect.

Although not clearly illustrated, source/drain regions may be formed on both sides of the areas in which the first through fourth gate electrodes 451 through 454 intersect the first through fourth active fins 410 through 440, and a plurality of contacts 450 may be formed.

Furthermore, a first shared contact 461 may simultaneously connect the second active fin 420, the third gate electrode 453, and a wiring 471. A second shared contact 462 may simultaneously connect the third active fin 430, the first gate electrode 451, and a wiring 472.

While the present disclosure has been particularly shown and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

What is claimed is:

1. A semiconductor device comprising:
a substrate which comprises a first surface and a second surface opposing each other;
a hard macro which is disposed on the first surface of the substrate and comprises a cell area and a halo area formed along a periphery of the cell area, and a first connection wiring disposed at a first metal level, the first connection wiring including a first wire, the first wire comprising a single linear segment that extends continuously from the cell area to the halo area at the first metal level;
a first power rail which is disposed on the second surface of the substrate and receives a first voltage; and
a first through via which penetrates the halo area and the substrate to connect the first power rail and the first connection wiring,
wherein the first through via is a single structure, and
wherein a portion of a bottom surface of the first wire directly contacts an upper surface of the first through via.

2. The semiconductor device of claim 1,
wherein the hard macro further comprises a second connection wiring disposed on the first connection wiring, and
wherein the second connection wiring does not overlap the halo area in a direction from the first surface of the substrate toward the second surface.

3. The semiconductor device of claim 1, wherein a width of the first through via is reduced in a direction from the second surface of the substrate toward the first surface.

4. The semiconductor device of claim 1, further comprising:
a power wiring which is disposed on the first power rail; and
a power via which connects the power wiring and the first power rail,
wherein a voltage provided to the first power rail is distributed by the power wiring and the power via.

5. The semiconductor device of claim 4, wherein a width of the power via is reduced in a direction from the first surface of the substrate toward the second surface.

6. The semiconductor device of claim 1, further comprising:
a second power rail which receives a second voltage different from the first voltage;
a second connection wiring which is disposed at the first metal level and has at least a part extending from the cell area to the halo area; and
a second through via which connects the second power rail and the second connection wiring.

7. The semiconductor device of claim 6, wherein the first voltage is a power supply voltage, and the second voltage is a ground voltage.

8. The semiconductor device of claim 1,
wherein the cell area comprises a first side and a second side which oppose each other in a length direction of the substrate and a third side and a fourth side which connect the first side and the second side and oppose each other in a width direction of the substrate,
wherein the first through via is one of a plurality of first through vias, and
wherein the plurality of first through vias are disposed in the halo area on at least one of the first through fourth sides.

9. The semiconductor device of claim 1, further comprising:
a logic area which is disposed on the first surface of the substrate and spaced apart from the hard macro and comprises a second connection wiring disposed at the first metal level;
a signal line which is disposed on the second surface of the substrate and spaced apart from the first power rail; and
a second through via which penetrates the substrate to connect the signal line and the second connection wiring.

10. The semiconductor device of claim 9, further comprising a third connection wiring which is disposed on the first connection wiring and the second connection wiring to connect the first connection wiring and the second connection wiring.

11. The semiconductor device of claim 1, wherein at least a part of the first power rail is buried in the substrate, and the first through via is directly connected to the first power rail.

12. A semiconductor device comprising:
a first substrate which comprises a power rail for providing a voltage and a signal line for transmitting a signal;
a second substrate which is disposed on the first substrate;
a logic area which is disposed on an upper surface of the second substrate;
a hard macro which is disposed on the upper surface of the second substrate and comprises a cell area and a halo area formed along a periphery of the cell area;
a first through via which is disposed in the halo area, penetrates the second substrate, and is connected to the power rail to provide the voltage to the hard macro; and
a second through via which is disposed in the logic area, penetrates the second substrate, and is connected to the signal line to provide the signal to the hard macro,
wherein the hard macro comprises a first connection wiring including a first wire, the first wire comprising a single linear segment that extends continuously from the cell area to the halo area at a same vertical level, and
wherein a portion of the bottom surface of the first wire directly contact an upper surface of the first through via.

13. The semiconductor device of claim 12,
wherein the logic area comprises a second connection wiring disposed at the first metal level,
wherein the first through via is directly connected to the first connection wiring, and
wherein the second through via is directly connected to the second connection wiring.

14. A semiconductor device comprising:
a substrate which comprises a first surface and a second surface opposing each other;
a hard macro which is disposed on the first surface of the substrate and comprises a cell area and a halo area formed along a periphery of the cell area, and a first connection wiring disposed at a first metal level, the first connection wiring including a first wire, the first wire comprising a single linear segment that extends continuously from the cell area to the halo area at the first metal level;

a logic area which is disposed on the first surface of the substrate, is spaced apart from the hard macro, and comprises a second connection wiring disposed at the first metal level;

first and second power rails which are disposed on the second surface of the substrate and spaced apart from each other;

a first through via which is disposed in the halo area of the hard macro and penetrates the halo area and the substrate to connect the first power rail and the first connection wiring; and a second through via which is disposed in the halo area of the hard macro and penetrates the substrate to connect the second power rail and the second connection wiring, wherein a portion of a bottom surface of the first wire directly contacts an upper surface of the first through via.

15. The semiconductor device of claim 14, wherein a width of the first through via and a width of the second through via are reduced in a direction from the second surface of the substrate toward the first surface.

16. The semiconductor device of claim 14, wherein the logic area further comprises a third connection wiring disposed at the first metal level, the semiconductor device further comprising:

a signal line which is disposed on the second surface of the substrate; and a third through via which penetrates the substrate to connect the signal line and the third connection wiring.

17. The semiconductor device of claim 16, wherein the third connection wiring is connected to the first connection wiring.

18. The semiconductor device of claim 16, wherein the logic area further comprises a third-fourth connection wiring disposed on the first connection wiring and the third connection wiring, and wherein the fourth connection wiring connects the first connection wiring to the third connection wiring.

* * * * *